(12) United States Patent
Hsiao et al.

(10) Patent No.: US 8,455,991 B2
(45) Date of Patent: Jun. 4, 2013

(54) INTEGRATED CIRCUIT PACKAGING SYSTEM WITH WARPAGE CONTROL AND METHOD OF MANUFACTURE THEREOF

(75) Inventors: Yung Kuan Hsiao, Singapore (SG); Xusheng Bao, Singapore (SG); Kang Chen, Singapore (SG); Hin Hwa Goh, Singapore (SG); Rui Huang, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 271 days.

(21) Appl. No.: 12/890,338

(22) Filed: Sep. 24, 2010

(65) Prior Publication Data

US 2012/0074588 A1 Mar. 29, 2012

(51) Int. Cl.
*H01L 21/56* (2006.01)

(52) U.S. Cl.
USPC .............. 257/678; 438/118; 438/127

(58) Field of Classification Search
USPC .......... 438/118, 110, 113, 127; 257/678, 257/712, E23.001, E23.003, E23.116
See application file for complete search history.

(56) References Cited

U.S. PATENT DOCUMENTS

| | | | | |
|---|---|---|---|---|
| 5,585,671 A * | 12/1996 | Nagesh et al. | | 257/697 |
| 5,811,317 A * | 9/1998 | Maheshwari et al. | | 29/827 |
| 6,605,355 B1 * | 8/2003 | Nazuka | | 428/414 |
| 6,828,676 B2 * | 12/2004 | Akai | | 257/720 |
| 6,919,224 B2 | 7/2005 | Sane et al. | | |
| 6,949,404 B1 * | 9/2005 | Fritz et al. | | 438/106 |
| 7,169,685 B2 | 1/2007 | Connell et al. | | |
| 7,446,423 B2 * | 11/2008 | Sakai et al. | | 257/783 |
| 7,498,198 B2 | 3/2009 | Charles et al. | | |
| 2002/0140108 A1 * | 10/2002 | Johnson | | 257/778 |
| 2003/0230800 A1 * | 12/2003 | Akai | | 257/711 |
| 2009/0121334 A1 * | 5/2009 | Oi et al. | | 257/678 |
| 2009/0271981 A1 * | 11/2009 | Hu et al. | | 29/832 |
| 2010/0120204 A1 * | 5/2010 | Kunimoto | | 438/118 |

* cited by examiner

*Primary Examiner* — Jarrett Stark
*Assistant Examiner* — Michele Fan
(74) *Attorney, Agent, or Firm* — Ishimaru & Associates LLP (57) ABSTRACT

A method of manufacture of an integrated circuit packaging system includes: providing an integrated circuit device having chip interconnects; applying an attachment layer directly on the integrated circuit device; attaching a device stiffener to the integrated circuit device with the attachment layer; attaching a chip carrier to the chip interconnects with the device stiffener attached to the integrated circuit device for controlling warpage of the integrated circuit device to prevent the warpage from causing some of the chip interconnects to separate from the chip carrier during attachment of the chip interconnects to the chip carrier; and applying an underfill between the chip carrier and the integrated circuit device for controlling connectivity of all the chip interconnects to the chip carrier.

14 Claims, 5 Drawing Sheets

INTEGRATED CIRCUIT PACKAGING SYSTEM WITH WARPAGE CONTROL AND METHOD OF MANUFACTURE THEREOF

TECHNICAL FIELD

The present invention relates generally to an integrated circuit packaging system, and more particularly to a system with warpage control.

BACKGROUND ART

Products must be capable of competing in world markets and attracting many consumers or buyers. Market growth for high density and high output/input integrated circuit packages has resulted in a trend for electronic products that are lightweight, smaller in size, multi-functional, and capable of ever increasing higher speeds.

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Smaller and thinner packages need to be electrically connected with other parts and components. As the smaller and thinner packages continue to get shrink in size, there is a critical need to produce products quickly, in high volumes, and with greater reliability.

Thus, an increasing need remains to increase the reliability and yield of packages as the sizes of the packages continue to shrink in size while the circuits inside those packages continue to increase. It is also critical that the electrical connections are created and placed with precision so that each of the electrical connections can be spaced apart from one another and reliably connected to the other parts and components. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an integrated circuit device having chip interconnects; applying an attachment layer directly on the integrated circuit device; attaching a device stiffener to the integrated circuit device with the attachment layer; attaching a chip carrier to the chip interconnects with the device stiffener attached to the integrated circuit device for controlling warpage of the integrated circuit device to prevent the warpage from causing some of the chip interconnects to separate from the chip carrier during attachment of the chip interconnects to the chip carrier; and applying an underfill between the chip carrier and the integrated circuit device for controlling connectivity of all the chip interconnects to the chip carrier.

The present invention provides an integrated circuit packaging system, including: an integrated circuit device having chip interconnects; an attachment layer directly on the integrated circuit device; a device stiffener attached to the integrated circuit device with the attachment layer; a chip carrier attached to the chip interconnects with the device stiffener attached to the integrated circuit device for controlling warpage of the integrated circuit device to prevent the warpage from causing some of the chip interconnects to separate from the chip carrier during attachment of the chip interconnects to the chip carrier; and an underfill between the chip carrier and the integrated circuit device for controlling connectivity of all the chip interconnects to the chip carrier.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGS. Similarly, although the views in the drawings shown for ease of description and generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
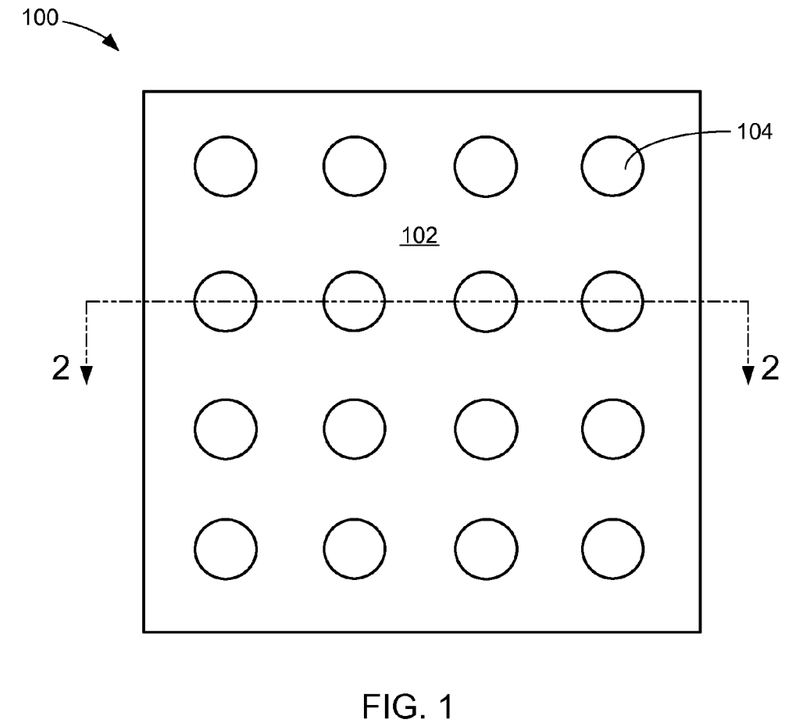
FIG. 1 is a bottom view of an integrated circuit packaging system in a first embodiment of the present invention.

Referring now to FIG. 1, therein is shown a bottom view of an integrated circuit packaging system 100 in a first embodiment of the present invention. The integrated circuit packaging system 100 is shown having a chip carrier 102 with package connectors 104 exposed on the chip carrier 102, which functions as a chip substrate.

The chip carrier 102 can include a substrate, an organic substrate, a wafer, or another die. The package connectors 104 are formed from a conductive material and used to connect the integrated circuit packaging system 100 to a next level of integration such as a printed circuit board, a system integrated circuit package, electronic subsystem, or combinations thereof.

Figure 2:
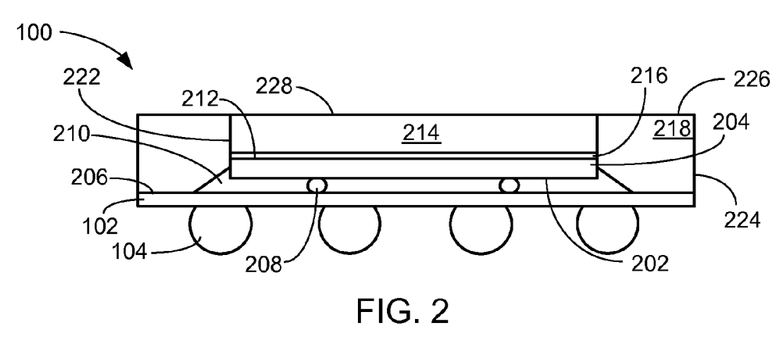
FIG. 2 is a cross-sectional view of FIG. 1 taken along a line 2-2 of FIG. 1.

Referring now to FIG. 2, therein is shown a cross-sectional view of FIG. 1 taken along a line 2-2 of FIG. 1. An active side 202 of an integrated circuit device 204 can be attached or connected to a component side 206 of the chip carrier 102 opposite a side of the chip carrier 102 having the package connectors 104. The active side 202 is defined as a side of the integrated circuit device 204 having active circuitry fabricated thereon or having elements for connection to the active circuitry within the integrated circuit device 204 that can include a flip chip, a die, an integrated circuit module, a discrete component, or combinations thereof.

Chip interconnects 208 of the integrated circuit device 204 are used to connect the active side 202 with conductive material exposed on the component side 206. The conductive material exposed on the component side 206 can provide connectivity with the package connectors 104.

The chip interconnects 208 can be formed with a conductive material having reflow properties similar to reflow properties of solder. An underfill 210 can be applied between the integrated circuit device 204 and the component side 206, surround the chip interconnects 208, and be on a perimeter of the integrated circuit device 204 to provide structural rigidity and protection to the chip interconnects 208.

It has been discovered that the underfill 210 eliminates defects from reflow processing attributed to materials or components of the integrated circuit packaging system 100 having different coefficient of thermal expansions (CTE).

An inactive side 212 of the integrated circuit device 204 opposite the active side 202 can be attached to a device stiffener 214 using an attachment layer 216. The attachment layer 216 serves to attach structures from both sides of this layer to each other and can include a bonding adhesive, an adhesive tape, a bonding agent, or adhesive film.

The attachment layer 216 can be applied using an bonding process that can include a laser process, an ultra violet process, a temperature cycling process, a chemical process, a mechanical vibration process, or combinations thereof.

Properties of the attachment layer 216 can include activation or de-activation by laser, ultra violet exposure, chemical exposure, temperature exposure, vibrations, applied forces, or combinations thereof, to enable a removal of or a permanent or a cured state of the attachment layer 216 between the device stiffener 214 and the inactive side 212. The properties of the attachment layer 216 can provide either a removal of the device stiffener 214 from the inactive side 212 or a permanent attachment of the device stiffener 214 to the inactive side 212.

The device stiffener 214 can include a dummy silicon wafer, a glass wafer, or other material having similar characteristics. The device stiffener 214 minimizes the effects due to any mismatch of coefficient of thermal expansions (CTE) between materials or components, including the chip carrier 102, of the integrated circuit packaging system 100. The device stiffener 214 can be used to absorb and dissipate heat generated by the integrated circuit device 204.

The device stiffener 214 minimizes or eliminates curvature or warpage of the integrated circuit device 204. The device stiffener 214 eliminates any functional defects that include electrical shorts, electrical opens, or structural cracks detrimental to the functionality or mean time before failure (MTBF) during assembly/manufacturing of the integrated circuit packaging system 100.

An encapsulation 218 over the component side 206 can cover the component side 206, the underfill 210, and portions of the integrated circuit device 204. The encapsulation 218 is a cover providing a hermetic seal to the parts of the integrated circuit packaging system 100 covered by the encapsulation 218. The encapsulation 218 can surround perimeter sides 222 of the device stiffener 214 to protect the contents of the integrated circuit packaging system 100.

The encapsulation 218 can include non-horizontal sides 224 intersecting a perimeter of the chip carrier 102. The encapsulation 218 can also include a top side 226 coplanar with and intersecting a stiffener side 228 of the device stiffener 214 and the non-horizontal sides 224. The stiffener side 228 is exposed from the top side 226 and can be parallel to the component side 206.

The encapsulation 218 can include non-horizontal sides 224 intersecting a perimeter of the chip carrier 102 and expose the perimeter of the chip carrier and a side of the chip carrier 102 opposite the component side 206. The encapsulation 218 can also include a top side 226 coplanar with and intersecting a stiffener side 228 of the device stiffener 214 and the non-horizontal sides 224. The stiffener side 228 is exposed from the top side 226 and can be parallel to the component side 206.

Figure 3:
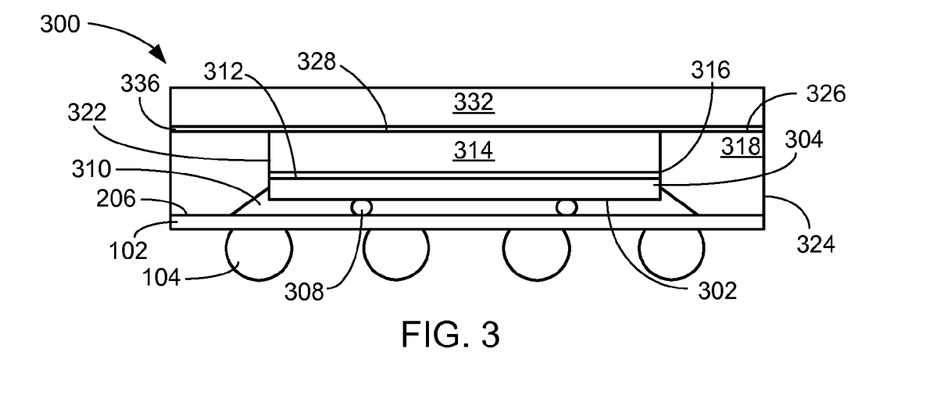
FIG. 3 is a cross-sectional view of an integrated circuit packaging system in a second embodiment of the present invention.

An active side 302 of an integrated circuit device 304 can be attached or connected to the component side 206 of the chip carrier 102 opposite the side of the chip carrier 102 having the package connectors 104. The active side 302 is defined as a side of the integrated circuit device 304 having active circuitry fabricated thereon or having elements for connection to the active circuitry within the integrated circuit device 304 that can include a flip chip, a die, an integrated circuit module, a discrete component, or combinations thereof.

Chip interconnects 308 can be used to connect the active side 302 with conductive material exposed on the component side 206. The conductive material exposed on the component side 206 can provide connectivity with the package connectors 104.

The chip interconnects 308 can be formed with a conductive material having reflow properties similar to reflow properties of solder. An underfill 310 can be applied between the integrated circuit device 304, surround the chip interconnects 308, and be on a perimeter of the integrated circuit device 304 to provide structural rigidity and protection to the chip interconnects 308.

An inactive side 312 of the integrated circuit device 304 opposite the active side 302 can be attached to a device stiffener 314 using an attachment layer 316. The attachment layer 316 can include a bonding adhesive, an adhesive tape, a bonding agent, or adhesive film. The attachment properties of the attachment layer 316 can be activated or de-activated by a laser, ultra violet exposure, chemical exposure, temperature exposure, vibrations, applied forces, or combinations thereof, to enable removal of or permanent connection of the device stiffener 314 to the inactive side 312.

The device stiffener 314 can include a dummy silicon wafer, a glass wafer, or other material having similar characteristics. The device stiffener 314 minimizes any mismatch of coefficient of thermal expansions (CTE) between materials or components, including the chip carrier 102, of the integrated circuit packaging system 300. The device stiffener 314 can be used to absorb and dissipate heat generated by the integrated circuit device 304.

The device stiffener 314 minimizes or eliminates curvature or warpage of the integrated circuit device 304. The device stiffener 314 eliminates any functional defects that include electrical shorts, electrical opens, or structural cracks detrimental to the functionality or mean time before failure (BTBF) during assembly/manufacturing of the integrated circuit packaging system 300.

An encapsulation 318 over the component side 206 can cover the component side 206, the underfill 310, and portions of the integrated circuit device 304. The encapsulation 318 can surround perimeter sides 322 of the device stiffener 314 to protect the contents of the integrated circuit packaging system 100.

The encapsulation 318 can include non-horizontal sides 324 intersecting a perimeter of the chip carrier 102. The encapsulation 318 can also include a top side 326 coplanar with and intersecting a stiffener side 328 of the device stiffener 314 and the non-horizontal sides 324. The stiffener side 328 is exposed from the top side 326 and can be parallel to the component side 206.

A thermal dissipater 332 having a conductive adhesive 336 can be attached directly on the stiffener side 328 and the top side 326. The conductive adhesive 336 can be formed from a thermally conductive adhesive that can include an adhesive layer, a stacking adhesive, or a combination thereof, having thermal conductive properties to transfer heat from the stiffener side 328 and the top side 326 to the thermal dissipater 332.

The thermal dissipater 332 can be formed from a thermal conductive material. Sides of the thermal dissipater 332 facing away from the integrated circuit packaging system 300 can have thermal emissive structural formations that can include grooved or finned sides. The thermal dissipater 332 provides the integrated circuit packaging system 300 with additional thermal dissipative capabilities.

It has been discovered that the thermal dissipater 332 attached directly to the device stiffener 314 and the encapsulation 318 enhances the heat dissipating capability and electrical performance of the integrated circuit packaging system 300.

Figure 4:
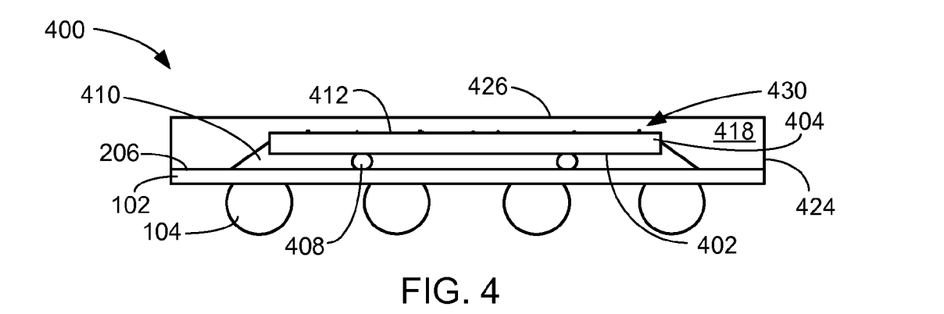
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. An active side 402 of an integrated circuit device 404 can be attached or connected to the component side 206 of the chip carrier 102 opposite a side of the chip carrier 102 having the package connectors 104.

The active side 402 is defined as a side of the integrated circuit device 404 having active circuitry fabricated thereon or having elements for connection to the active circuitry within the integrated circuit device 404 that can include a flip chip, a die, an integrated circuit module, a discrete component, or combinations thereof.

Chip interconnects 408 can be used to connect the active side 402 with conductive material exposed on the component side 206. The conductive material exposed on the component side 206 can provide connectivity with the package connectors 104.

The chip interconnects 408 can be formed with a conductive material having reflow properties similar to reflow properties of solder. An underfill 410 can be applied between the integrated circuit device 404, surround the chip interconnects 408, and be on a perimeter of the integrated circuit device 404 to provide structural rigidity and protection to the chip interconnects 408.

An encapsulation 418 can cover an inactive side 412 of the integrated circuit device 404, the underfill 410, and the component side 206. The encapsulation 418 can protect the contents of the integrated circuit packaging system 400.

The encapsulation 418 can include non-horizontal sides 424 intersecting a perimeter of the chip carrier 102. The encapsulation 418 can also include a top side 426 coplanar with the component side 206 and intersecting the non-horizontal sides 424.

The inactive side 412 of the integrated circuit device 404 can include a residue 430 or particulates as a result of the removal of the bonding adhesive, the adhesive tape, the bonding agent, or the adhesive film. The residue 430 or particulates can include microscopic portions of the bonding material, the adhesive material, the bonding agents, or the adhesive film.

It has been discovered that the integrated circuit device 404 is prevented from warpage or cracking by the encapsulation 418 surrounding an upper half of the integrated circuit device 404 and the underfill 410 surrounding a lower half of the integrated circuit device 404.

Figure 5:
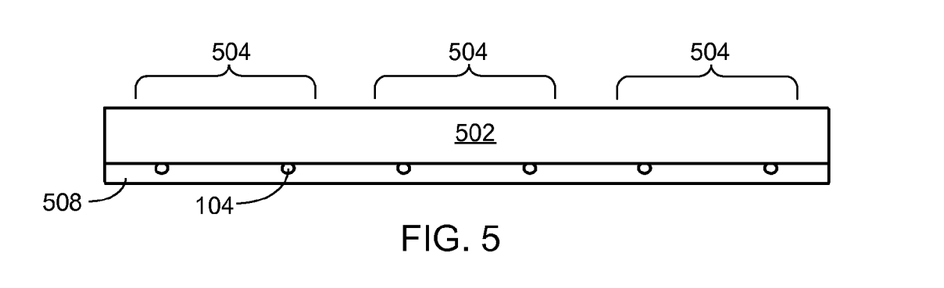
FIG. 5 is a cross-sectional view of the integrated circuit packaging system of FIG. 2 in a temporary carrier attachment phase.

Referring now to FIG. 5, therein is shown a cross-sectional view of the integrated circuit packaging system of FIG. 2 in a temporary carrier attachment phase. Shown is a silicon device wafer 502 having build sites 504. Each of the build sites 504 can be used to create the integrated circuit device 204. The build sites 504 can include circuitry, wiring, and electrical conductors on a side of the silicon device wafer 502 that is identical to circuitry, wiring, and electrical conductors on the active side 202 of FIG. 2 of the integrated circuit device 204 of FIG. 2, respectively.

The electrical conductors on the side of the silicon device wafer 502 can be attached to the package connectors 104 before or during the temporary carrier attachment phase using a reflow process. The temporary carrier attachment process can include covering the package connectors 104 and the side of the silicon device wafer 502 with a temporary carrier 508. The temporary carrier 508 can be formed of a material capable of providing structural rigidity or of protection for the side of the silicon device wafer 502.

Figure 6:
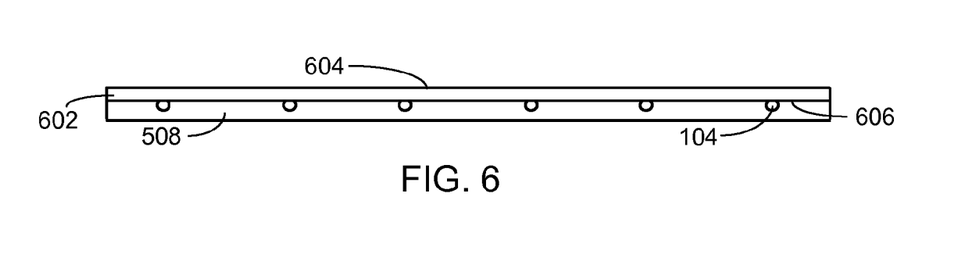
FIG. 6 is the cross-sectional view of FIG. 5 in a wafer thinning phase.

Referring now to FIG. 6, therein is shown the cross-sectional view of FIG. 5 in a wafer thinning phase. A portion of the silicon device wafer 502 of FIG. 5 can be removed using a material removal process to form an integrated circuit wafer 602 having a wafer inactive side 604 opposite a connection side 606 connected to the package connectors 104.

The material removal process can include a grinding, a sanding, a cutting, a sawing, a polishing, or combinations thereof. The wafer inactive side 604 can preferably be parallel with the connection side 606.

It has been discovered that the temporary carrier 508 protects the package connectors 104 and the connection side 606 from damage or contamination during the material removal process.

Figure 7:
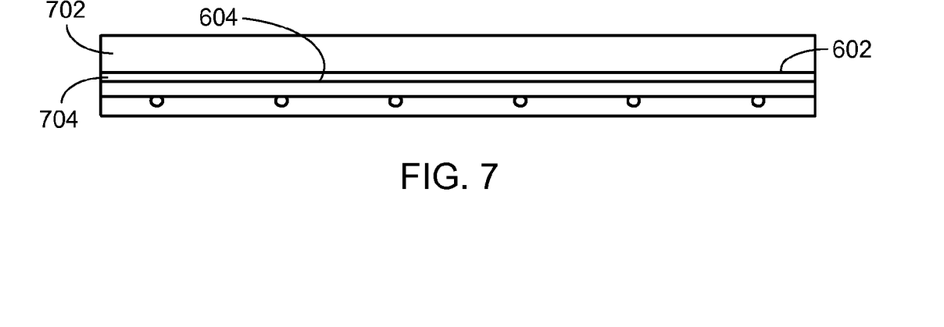
FIG. 7 is the cross-sectional view of FIG. 6 in a stiffener attachment phase.

Referring now to FIG. 7, therein is shown the cross-sectional view of FIG. 6 in a stiffener attachment phase. A wafer device stiffener 702 can be attached directly to the wafer inactive side 604 of the integrated circuit wafer 602 using a wafer attachment layer 704. The wafer attachment layer 704 can be formed and applied on the wafer inactive side 604 and the wafer device stiffener 702 in a manner identical to the attachment layer 216 of FIG. 2, the inactive side 212 of FIG. 2, and the device stiffener 214 of FIG. 2, respectively. The bonding process can be used attach the wafer device stiffener 702 directly to the wafer inactive side 604 using the wafer attachment layer 704.

Figure 8:
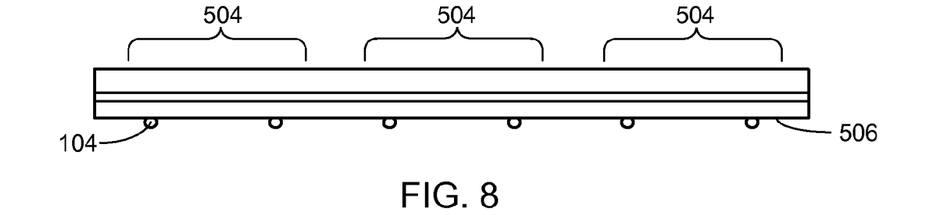
FIG. 8 is the cross-sectional view of FIG. 7 in a temporary carrier removal phase.

Referring now to FIG. 8, therein is shown the cross-sectional view of FIG. 7 in a temporary carrier removal phase. The temporary carrier 508 of FIG. 5 can be removed from the connection side 506 using a carrier removal process.

The carrier removal process can include a de-bonding process that can include a laser process, an ultra violet process, a temperature cycling process, a chemical process, a mechanical vibration process, or combinations thereof. The de-bonding process enables the temporary carrier 508 to be removed in such a manner as to retain structural integrity, electrical integrity, and attachment properties of the package connectors 104 for further manufacturing or assembly processing.

Figure 9:
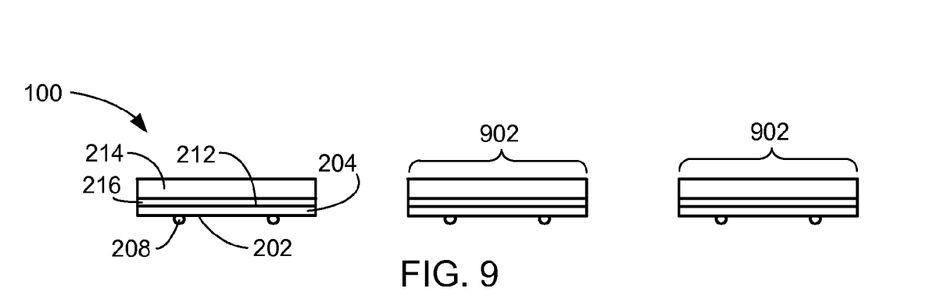
FIG. 9 is the cross-sectional view of FIG. 8 in a wafer singulation phase.

Referring now to FIG. 9, therein is shown the cross-sectional view of FIG. 8 in a wafer singulation phase. The wafer singulation phase can be used to form base assemblies 902 by separating portions of the structure of FIG. 8 from one another.

Each of the base assemblies 902 can include the device stiffener 214 attached directly to the inactive side 212 of the integrated circuit device 204 using the attachment layer 216, and the chip interconnects 208 connected to the active side 202 of the integrated circuit device 204. The wafer singulation phase includes a singulation process that can include a cutting process or a sawing process.

Figure 10:
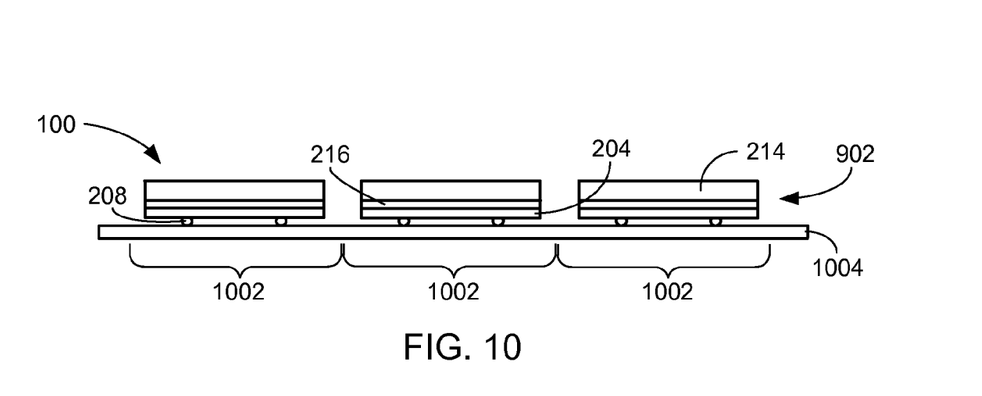
FIG. 10 is the cross-sectional view of FIG. 9 in a die attach phase.

Referring now to FIG. 10, therein is shown the cross-sectional view of FIG. 9 in a die attach phase. The chip interconnects 208 of each of the base assemblies 902 can be attached over base areas 1002 of a wafer chip carrier 1004 using a component attachment process that can include a cleaning process, a reflow process, or a temperature cycling process. Each of the base areas 1002 of the wafer chip carrier 1004 can preferably include the chip carrier 102 of FIG. 2.

It has been discovered that the device stiffener 214 and the attachment layer 216 prevents warpage or loss of electrical connectivity between the integrated circuit device 204 and the wafer chip carrier 1004 due to contractive or tensile forces from CTE mismatches.

Figure 11:
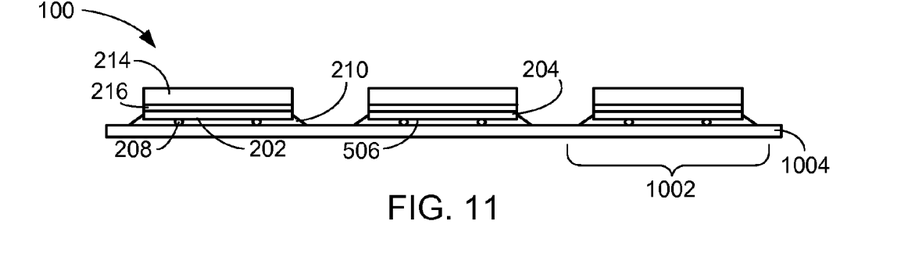
FIG. 11 is the cross-sectional view of FIG. 10 in an underfill phase.

Referring now to FIG. 11, therein is shown the cross-sectional view of FIG. 10 in an underfill phase. The underfill 210 can be applied between the integrated circuit device 204 and the wafer chip carrier 1004, surround the chip interconnects 208, and be on a perimeter of the integrated circuit device 204 using a fill process that can include a cleaning process, an injection process, a heating process, or a cooling process. The underfill 210 is in a cured state with the device stiffener 214 and the attachment layer 216 attached to the integrated circuit device 204 as a result of the underfill phase.

The underfill phase can be combined with other process phases to further minimize or prevent warpage of the integrated circuit device 204. For example, the underfill phase can optionally be combined with the component attachment process by applying and curing the underfill 210 at a temperature T2 lower than a reflow temperature T1 of the component attachment process.

It has been discovered that applying and curing the underfill 210 during the reflow processing of the integrated circuit device 204 prevents warpage of the integrated circuit device 204.

For example, the underfill 210 in a cured state provides a mechanical bond between the integrated circuit device 204 and the wafer chip carrier 1004 to prevent any portion of the integrated circuit device 204 from warping away from the wafer chip carrier 1004.

It has been discovered that the device stiffener 214 and the underfill 210 eliminates electrical shorts, electrical opens, or resistive connections between the integrated circuit device 204 and the wafer chip carrier 1004.

For example, the device stiffener 214 and the underfill 210 provides sufficient structural support and surface contact to dissipate heat from and to prevent heat induced warpage of the integrated circuit device 204.

Assembly units can be formed from the wafer chip carrier 1004 using the singulation process. Each of the assembly units include one of the base areas 1002, the underfill 210, the device stiffener 214, the attachment layer 216, the chip interconnects 208, and the integrated circuit device 204. The assembly units can be further processed to form the integrated circuit packaging system 100 of FIG. 2 or the integrated circuit packaging system 300 of FIG. 3.

Figure 12:
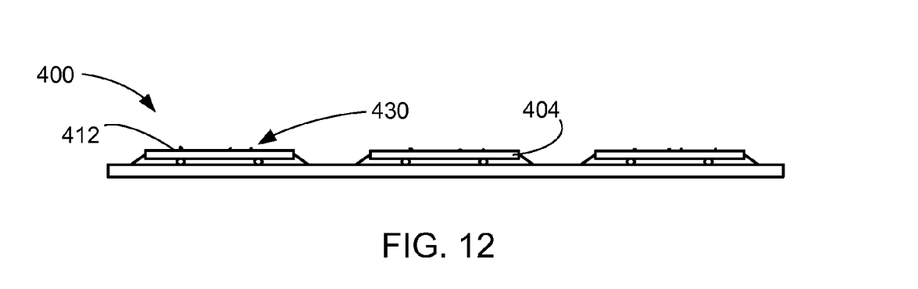
FIG. 12 is the cross-sectional view of FIG. 11 in stiffener removal phase of the integrated circuit packaging system of FIG. 4.

Referring now to FIG. 12, therein is shown the cross-sectional view of FIG. 11 in stiffener removal phase of the integrated circuit packaging system 400 of FIG. 4. The underfill phase described in FIG. 11 for the formation of integrated circuit packaging system 100 of FIG. 2 can be followed by the stiffener removal phase in a formation process for manufacture of the integrated circuit packaging system 400 of FIG. 4.

A device stiffener (not shown) present during an underfill phase for the manufacture of the integrated circuit packaging system 400 can be removed from the active side 412 of the integrated circuit device 404 using a stiffener removal process during the stiffener removal phase The stiffener removal process can include a de-bonding process that can include a laser process, an ultra violet process, a temperature cycling process, a chemical process, a mechanical vibration process, or combinations thereof. The stiffener removal process can preferably occur after the underfill 210 is in the cured state. The stiffener removal process results in the formation of the residue 430 of FIG. 4 on the inactive side 212 of the integrated circuit device 204.

Figure 13:
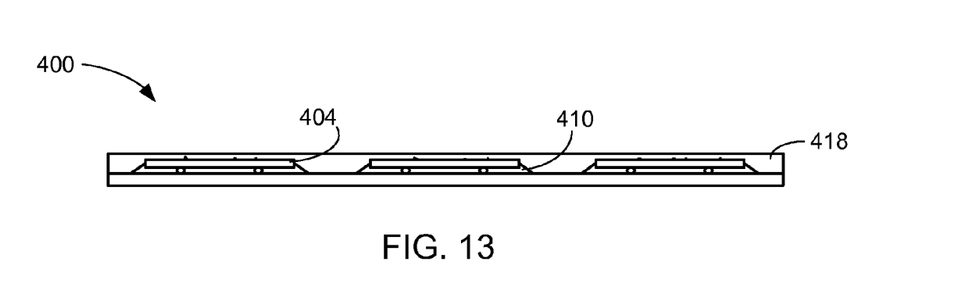
FIG. 13 is the cross-sectional view of FIG. 12 in a mold phase.

Referring now to FIG. 13, therein is shown the cross-sectional view of FIG. 12 in a mold phase. A top side of the structure of FIG. 12 having the integrated circuit device 404 can be encapsulated with the encapsulation 418 using a mold process. The encapsulation 418 can cover the integrated circuit device 404 and the underfill 410. The mold process can include an injection process with mold chase (not shown), a heating process, or a cooling process.

Figure 14:
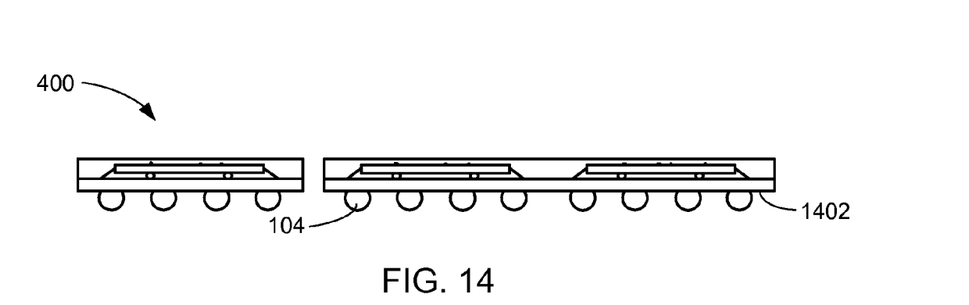
FIG. 14 is the cross-sectional view of FIG. 13 in a singulation phase.

Referring now to FIG. 14, therein is shown the cross-sectional view of FIG. 13 in a singulation phase. The package connectors 104 can be attached to a bottom side 1402 of the structure of FIG. 13, opposite the top side, using the component attachment process. Portions of the structure of FIG. 13 can be separated from one another to form the integrated circuit packaging system 400 of FIG. 4 using the singulation process.

Figure 15:
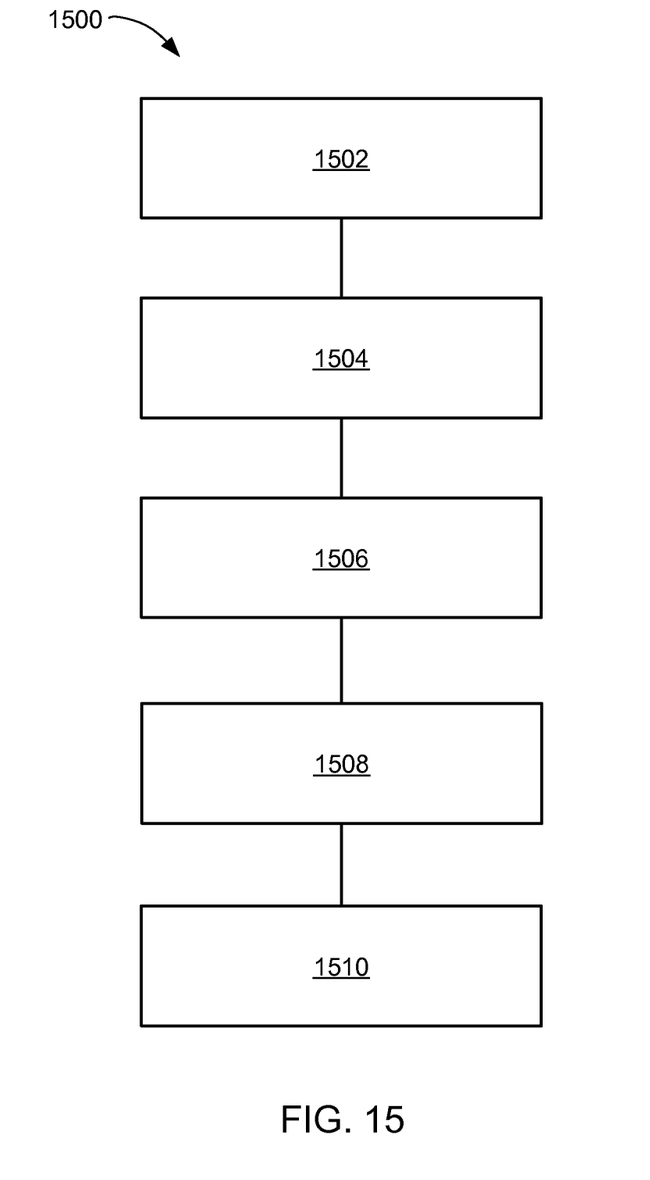
FIG. 15 is a flow chart of a method of manufacture of the integrated circuit packaging system in a further embodiment of the present invention.

Referring now to FIG. 15, therein is shown a flow chart of a method 1500 of manufacture of the integrated circuit packaging system 100 in a further embodiment of the present invention. The method 1500 includes: providing an integrated circuit device having chip interconnects in a block 1502; applying an attachment layer directly on the integrated circuit device in a block 1504; attaching a device stiffener to the integrated circuit device with the attachment layer in a block 1506; attaching a chip carrier to the chip interconnects with the device stiffener attached to the integrated circuit device for controlling warpage of the integrated circuit device to prevent the warpage from causing some of the chip interconnects to separate from the chip carrier during attachment of the chip interconnects to the chip carrier in a block 1508; and applying an underfill between the chip carrier and the integrated circuit device for controlling connectivity of all the chip interconnects to the chip carrier in a block 1510.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing an integrated circuit device having chip interconnects;
    applying an attachment layer directly on the integrated circuit device;
    attaching a device stiffener to the integrated circuit device with the attachment layer;
    attaching a chip carrier to the chip interconnects with the device stiffener attached to the integrated circuit device for controlling warpage of the integrated circuit device to prevent the warpage from causing some of the chip interconnects to separate from the chip carrier during attachment of the chip interconnects to the chip carrier;
    applying an underfill between the chip carrier and the integrated circuit device for controlling connectivity of all the chip interconnects to the chip carrier;
    applying an encapsulation over a component side of the chip carrier and surrounding the device stiffener the encapsulation exposing a stiffener side of the device stiffener and a side of the chip carrier opposite the component side;
    wherein applying the encapsulation includes applying the encapsulation having a to side coplanar with the stiffener side; and
    attaching a thermal dissipater over the device stiffener.

2. The method as claimed in claim 1 wherein applying the underfill includes curing the underfill with the device stiffener attached to the integrated circuit device.

3. The method as claimed in claim 1 wherein applying the encapsulation includes applying the encapsulation to cover portions of the integrated circuit device.

4. A method of manufacture of an integrated circuit packaging system comprising:
    providing an integrated circuit device having chip interconnects;
    applying an attachment layer directly on the integrated circuit device;
    attaching a device stiffener to the integrated circuit device with the attachment layer;
    attaching a chip carrier to the chip interconnects with the device stiffener attached to the integrated circuit device for controlling warpage of the integrated circuit device to prevent the warpage from causing some of the chip interconnects to separate from the chip carrier during attachment of the chip interconnects to the chip carrier;
    applying an underfill between the chip carrier and the integrated circuit device for controlling connectivity of all the chip interconnects to the chip carrier;
    applying an encapsulation over a component side of the chip carrier and surrounding the device stiffener . . . opposite the component side;
    wherein applying the encapsulation includes applying the encapsulation having a top side coplanar with the stiffener side;
    attaching a thermal dissipater over the device stiffener; and
    attaching a package connector directly on the chip carrier.

5. The method as claimed in claim 4 wherein applying the underfill includes curing the underfill with the device stiffener and the attachment layer attached to the integrated circuit device.

6. The method as claimed in claim 4 further comprising applying the encapsulation includes applying the encapsulation over an inactive side of the integrated circuit device.

7. An integrated circuit packaging system comprising:
an integrated circuit device having chip interconnects;
an attachment layer directly on the integrated circuit device;
a device stiffener attached to the integrated circuit device with the attachment layer;
a chip carrier attached to the chip interconnects with the device stiffener attached to the integrated circuit device for controlling warpage of the integrated circuit device to prevent the warpage from causing some of the chip interconnects to separate from the chip carrier during attachment of the chip interconnects to the chip carrier;
an underfill between the chip carrier and the integrated circuit device for controlling connectivity of all the chip interconnects to the chip carrier;
an encapsulation over a component side of the chip carrier and surrounding the
device stiffener . . . opposite the component side exposed from the encapsulation;
wherein a to side of the encapsulation is coplanar with the stiffener side; and
a thermal dissipater over the device stiffener.

8. The system as claimed in claim 7 wherein the underfill is in a cured state with the device stiffener attached to the integrated circuit device.

9. The system as claimed in claim 7 further comprising a portion of the integrated circuit device covered by the encapsulation.

10. The system as claimed in claim 7 further comprising a package connector directly on the chip carrier.

11. The system as claimed in claim 10 further comprising a top side of the encapsulation intersecting and coplanar with the stiffener side.

12. The system as claimed in claim 10 wherein the underfill is in a cured state with the device stiffener and the attachment layer attached to the integrated circuit device.

13. The system as claimed in claim 10 wherein the encapsulation is over an inactive side of the integrated circuit device.

14. The system as claimed in claim 10 further comprising a thermal dissipater having a conductive adhesive directly on the device stiffener.

* * * * *

UNITED STATES PATENT AND TRADEMARK OFFICE
CERTIFICATE OF CORRECTION

PATENT NO.      : 8,455,991 B2                                           Page 1 of 1
APPLICATION NO. : 12/890338
DATED           : June 4, 2013
INVENTOR(S)     : Hsiao et al.

It is certified that error appears in the above-identified patent and that said Letters Patent is hereby corrected as shown below:

In the Specification:

1. Delete the paragraph which begins in Column 4, line 64, and ends in Column 5, line 3.

2. Column 5, line 13, insert the paragraph:

-- Referring now to FIG. 3, therein is shown a cross-sectional view of an integrated circuit packaging system 300 in a second embodiment of the present invention. The integrated circuit packaging system 300 is shown having the chip carrier 102 with the package connectors 104 exposed on the chip carrier 102. --.

In the Claims:

3. Column 10, claim 1, line 30, delete "a to side" and insert therefor -- a top side --.

4. Column 10, claim 4, line 57, delete "stiffener . . ." and insert therefor

-- stiffener, the encapsulation exposing a stiffener side of the device stiffener and a side of the chip carrier --.

5. Column 11, claim 7, line 20, delete "stiffener . . ." and insert therefor

-- stiffener, a stiffener side of the device stiffener and a side of the chip carrier --.

6. Column 11, claim 7, line 22, delete "a to side" and insert therefor -- a top side --.

Signed and Sealed this
Eighth Day of December, 2015

Michelle K. Lee
*Director of the United States Patent and Trademark Office*